United States Patent
Christensen et al.

(10) Patent No.: US 6,941,389 B2
(45) Date of Patent: Sep. 6, 2005

(54) SYSTEM AND METHOD FOR PROCESSING I/O BY DISABLING OUTPUT FOR CONFIGURATION PROCESSOR WHEN PROCESSOR CLOCK IS INACTIVE AND RESUMING PROCESSOR AFTER PREDETERMINED PERIOD OF TIME

(75) Inventors: John E. Christensen, Omaha, NE (US); Jay Greene, Omaha, NE (US); Jeff Nowlin, Counsel Bluffs, IA (US); Timothy J. Walpus, Omaha, NE (US); Scott J. Smith, Fremont, NE (US)

(73) Assignee: First Data Corporation, Englewood, CO (US)

( * ) Notice: Subject to any disclaimer, the term of this patent is extended or adjusted under 35 U.S.C. 154(b) by 156 days.

(21) Appl. No.: 10/313,475

(22) Filed: Dec. 6, 2002

(65) Prior Publication Data

US 2003/0188047 A1 Oct. 2, 2003

Related U.S. Application Data

(60) Provisional application No. 60/368,504, filed on Mar. 29, 2002.

(51) Int. Cl.$^7$ .......................... G06F 3/00; G06F 13/00; H04L 1/24

(52) U.S. Cl. .............................. 710/15; 710/5; 710/14; 710/16; 710/17; 710/18; 710/19; 710/38; 370/242

(58) Field of Search ................................. 710/5, 14–19, 710/38; 370/242; 257/734; 361/733, 773

(56) References Cited

U.S. PATENT DOCUMENTS

| | | | | | |
|---|---|---|---|---|---|
| 5,757,275 | A | * | 5/1998 | Mowry, Jr. | 340/664 |
| 6,252,853 | B1 | * | 6/2001 | Ohno | 370/242 |
| 6,669,186 | B2 | * | 12/2003 | Tunink et al. | 271/9.11 |

* cited by examiner

Primary Examiner—Tammara Peyton
(74) Attorney, Agent, or Firm—Townsend and Townsend and Crew, LLP

(57) ABSTRACT

Systems and methods for accepting and producing various I/O. The systems can include a plurality of input connectors and/or output connectors integral to a board, a circuit to disable the output connectors, and a programmable logic controller modular to the board and electrically coupled to the plurality of input connectors and the plurality of output connectors. The programmable logic controller can be associated with a computer readable medium that incorporates instructions executable by the programmable logic controller to configure one or more of the input and/or output connectors, and/or to at least partially control an output timeout state.

25 Claims, 22 Drawing Sheets

| Figure 1-1 | Figure 1-4 | Figure 1-8 | Figure 1-11 | Figure 1-15 | Figure 1-17 |
|---|---|---|---|---|---|
| Figure 1-2 | Figure 1-5 | Figure 1-9 | Figure 1-12 | Figure 1-16 | |
| | Figure 1-6 | | Figure 1-13 | | |
| Figure 1-3 | Figure 1-7 | Figure 1-10 | Figure 1-14 | | Figure 1-18 |

Figure 1

SYSTEM AND METHOD FOR PROCESSING I/O BY DISABLING OUTPUT FOR CONFIGURATION PROCESSOR WHEN PROCESSOR CLOCK IS INACTIVE AND RESUMING PROCESSOR AFTER PREDETERMINED PERIOD OF TIME

CROSS-REFERENCES TO RELATED APPLICATIONS

The present application claims priority to U.S. Provisional Pat. App. No. 60/368,504, entitled PLC I/O SYSTEM FOR PROCESSING MAIL filed on Mar. 29, 2002. The entirety of the aforementioned U.S. provisional patent application is incorporated herein by reference for all purposes.

BACKGROUND OF THE INVENTION

The present invention relates to systems and methods for processing and distributing mail, and in particular to systems and methods for processing I/O.

Mail processing in a large consumer service provider is a cumbersome endeavor. Systems and methods for automatically processing the mail have been developed. Such systems and methods have reduced the necessity for manually processing mail for distribution and have provided significant efficiencies. Such systems and methods, however, require processing of significant input/output (I/O) signals. To date, I/O processing capabilities are limited in various ways that make implementation of the automatic systems and methods more complex.

Further, production of prototype circuit boards, such as I/O processing boards, can be both cumbersome and expensive. For example, hundreds of leads from semiconductor chips must be soldered to a board. This can be very labor intensive and often damages the board. Alternatively, a solder stencil may be made, and the boards populated and soldered in an automatic soldering machine. However, such a process involves significant non-recurring engineering expenses.

Thus, there is a need in the art for advanced I/O processing capabilities, and methods for manufacturing such capability.

BRIEF SUMMARY OF THE INVENTION

Among other things, the present invention provides systems and methods related to processing I/O. In some embodiments, the systems and methods include a circuit board for processing I/O and methods for manufacturing such circuit boards.

Various embodiments of the present invention provide systems for accepting and producing various I/O. The systems include a plurality of input connectors and/or output connectors integral to a board. In one particular instance, the plurality of input connectors and the plurality of output connectors are configurable to be either inputs or outputs. The systems further include a programmable logic controller modular to the board and electrically coupled to the plurality of input connectors and the plurality of output connectors. The programmable logic controller is associated with a computer readable medium that comprises instructions executable by the programmable logic controller to output a timer clock signal associated with the plurality of output signals.

In various instances, the plurality of output connectors include a power source, that is individually fused to each of the plurality of output connectors. In other cases, the computer readable medium further comprises instructions to configure at least one of the plurality of input connectors to drive an output, and to drive the output, and/or instructions to configure at least one of the plurality of output connectors to receive an input, and to receive an input signal therefrom. In yet other instances, a hardware circuit is included to disable the plurality of output connectors when the timer clock signal goes inactive for a period, which in some cases is approximately 650 milliseconds. In certain cases, the period is a first period, and the system includes a hardware circuit to maintain the output connectors in the disabled state for a second period after the timer clock signal becomes active again. In some cases, the second period is more than the time required to reset the programmable logic controller. In particular cases, the computer readable medium further comprises instructions to maintain the output connectors in the disabled state for a second period after the timer clock signal becomes active again, and to activate the output connectors after the second period has expired.

In other cases, the computer readable medium further comprises instructions to disable an input connector that has been configured as an output. The input connector is disabled when the timer clock signal goes inactive for a period, and stays inactive for another period.

Other embodiments provide methods for receiving and driving I/O in a mail processing system. The methods include providing a set of configurable I/O ports, wherein each I/O port in the set of configurable I/O ports can be configured to be an I/O selected from a group consisting of an input and an output. The methods further include providing a configuration processor modularly coupled to the set of configurable I/O ports, programming the configuration processor to configure a first I/O port of the set of I/O ports as an input and a second I/O port of the set of I/O ports as an output, disabling the output when a timer associated with the configuration processor goes inactive for a first period, and enabling the disabled output when the timer associate with the configuration processor resumes activity for a second period. Further, in some cases, a fuse is provided in relation to each of the set of configurable I/O ports. Also, the methods can include resetting the processor after the first period.

In yet other embodiments, methods for preparing circuits are provided. The methods include preparing an I/O circuit board where the I/O circuit board has lead lines and at least a first I/O port and a second I/O port. The I/O board is populated with one or more semiconductor chips touching the lead lines, and a bead of solder is placed in proximity to the one or more semiconductor chips near locations where the one or more semiconductor chips touch the lead lines. The I/O board is baked until the bead of solder melts, thus adhering the semiconductor chips to the lead lines. A processor is attached to the I/O circuit board, and programmed to configure a first I/O port as an input and the second I/O port as an output, disable the output when a timer associated with the processor goes inactive for a first period, and enable the disabled output when the timer associate with the configuration processor resumes activity. In some cases, programming the timer to disable the outputs includes selecting circuitry to define a time-out period.

This summary provides only a general outline of the embodiments according to the present invention. Many other objects, features and advantages of the present invention will become more fully apparent from the following detailed description, the appended claims and the accompanying drawings.

BRIEF DESCRIPTION OF THE DRAWINGS

A further understanding of the nature and advantages of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 2 is a flow diagram of a method for processing I/O in accordance with embodiments of the present invention;

FIG. 3 illustrates elements that can be used in manufacturing circuit boards in accordance with various embodiments of the present invention; and FIG. 4 is a flow diagram of a method in accordance with embodiments of the present invention.

DETAILED DESCRIPTION OF THE INVENTION

Figure 1:
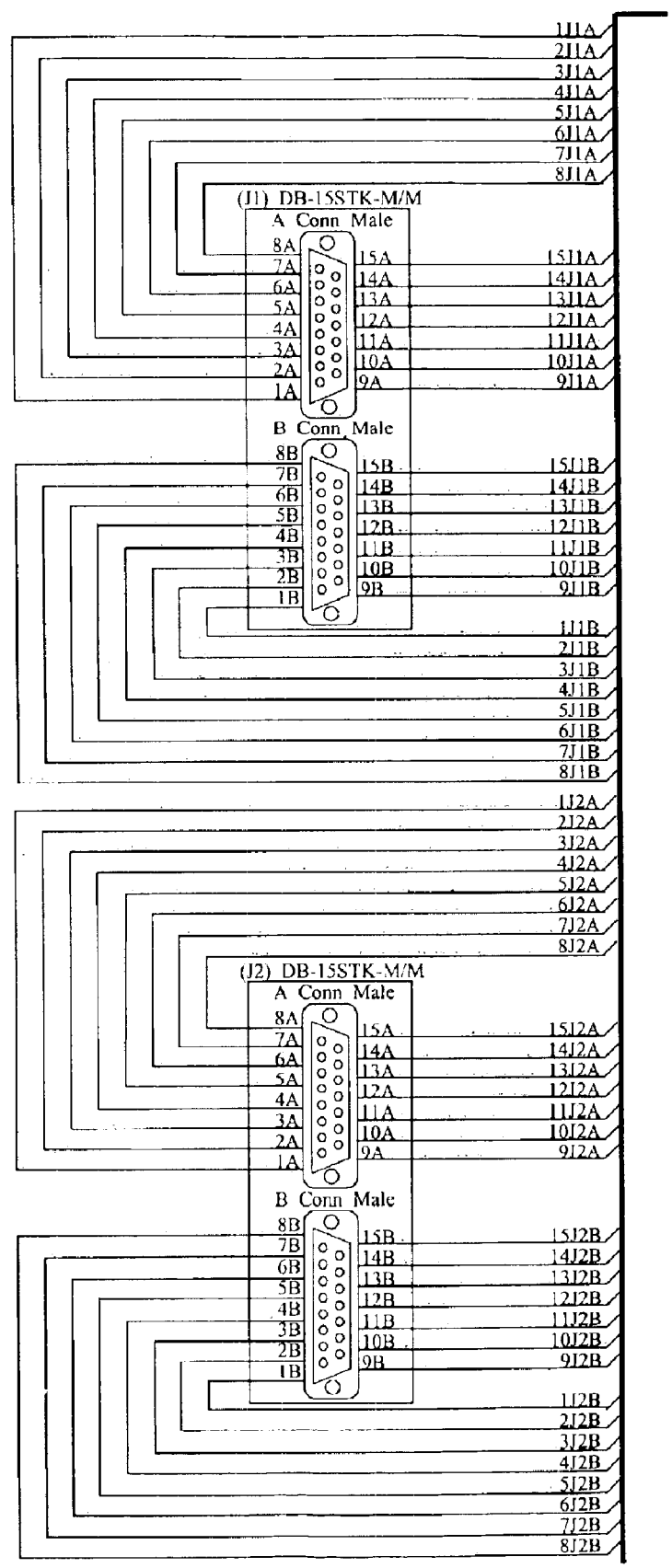
FIGS. 1, and 1-1 through 1-18 are a schematic diagram of an embodiment of the present intention.

One embodiment of the present invention includes an addressable I/O board for extending I/O for one or more Programmable Logic Controllers (PLC) that are insertable into the board. FIG. 1 illustrates a sectional assembly of Figures TBD into an overall schematic of the embodiment. The discussion that follows the sections of the schematic.

Figures 1, 2:
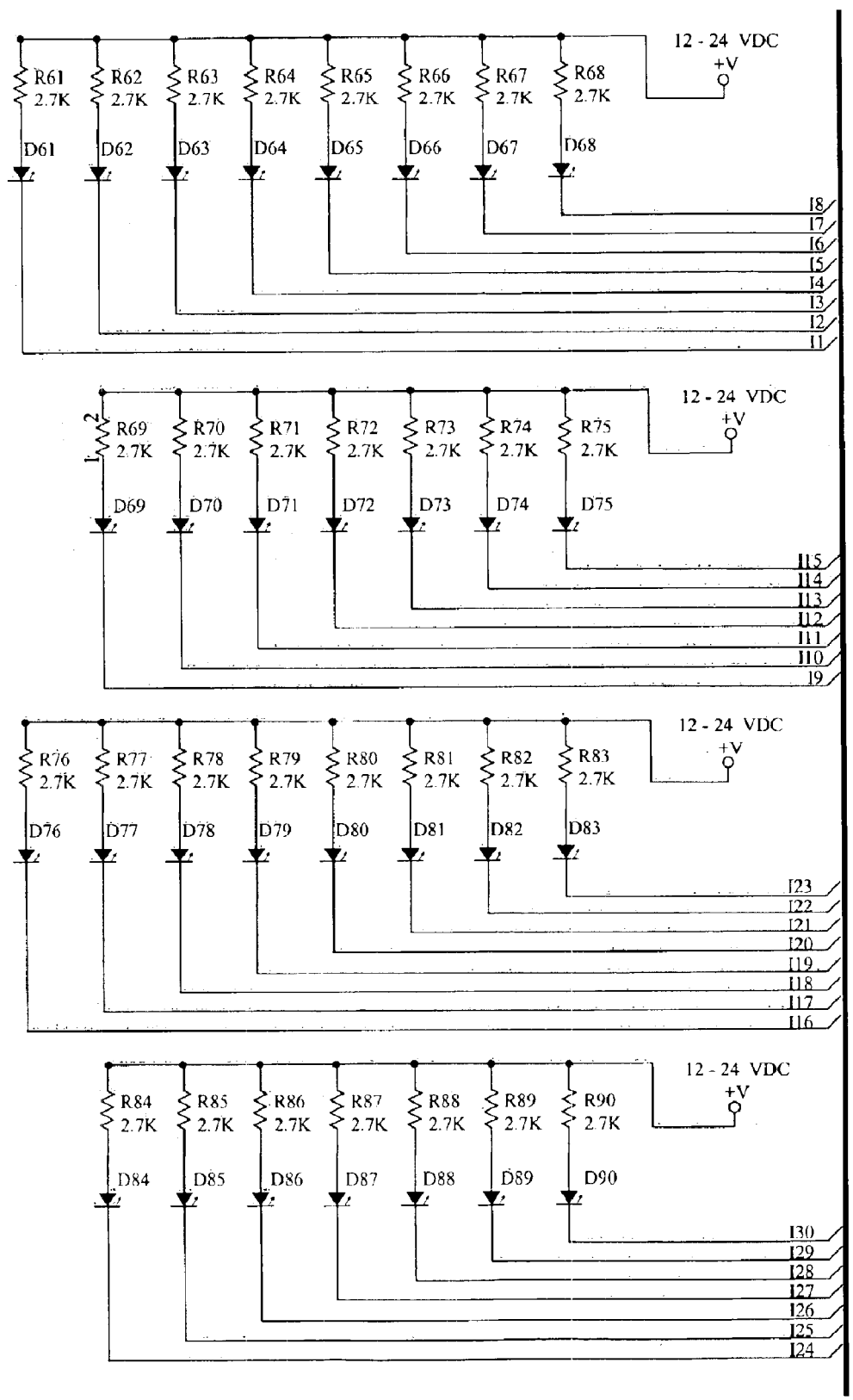
Figures 1, 2, 3:
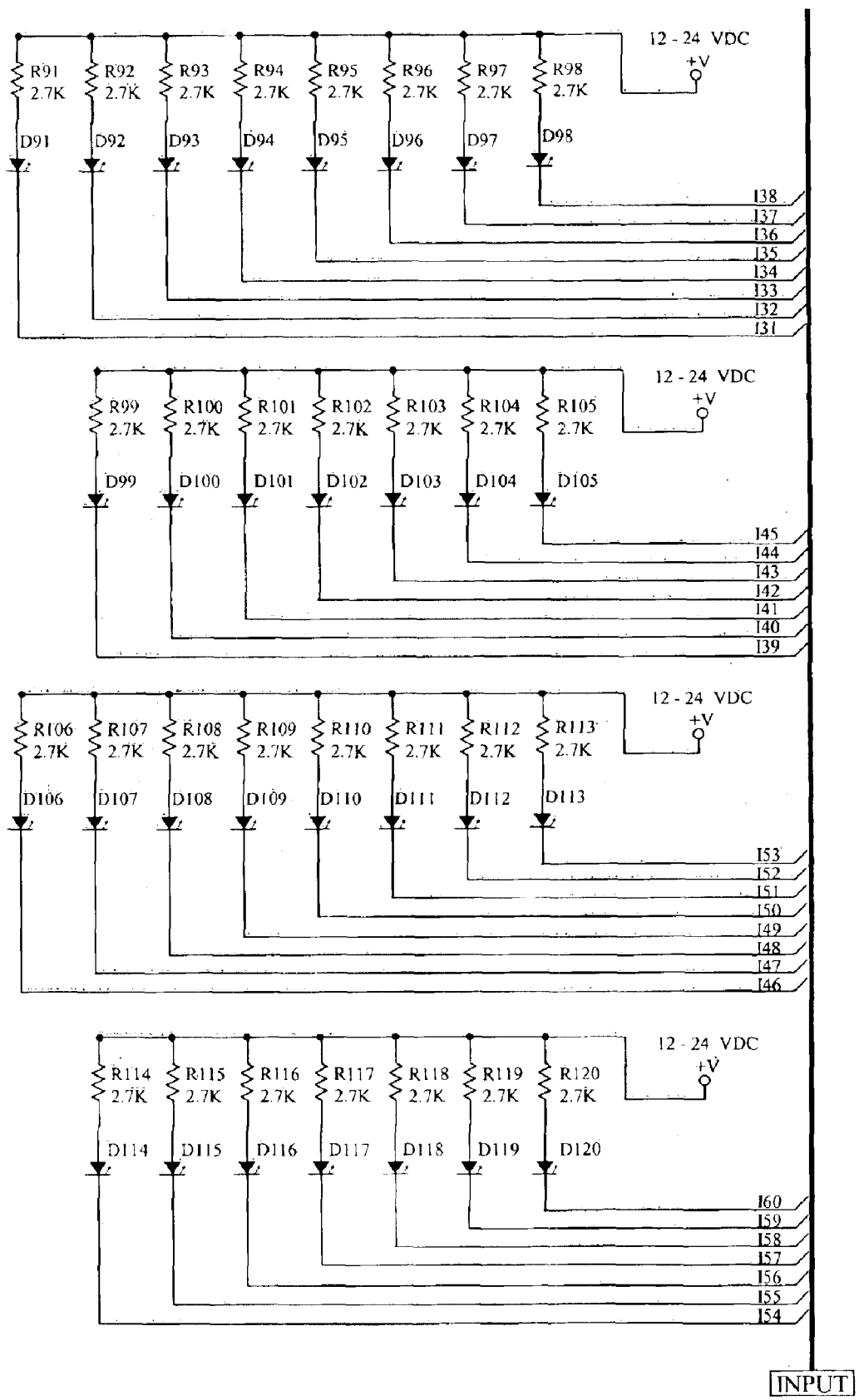

As illustrated in FIGS. 1-1 through 1-3, the board includes sixty digital input lines (I1–I60). Each of the digital input lines are associated with a light emitting diode (LED) (D61–D120) and biased with a input voltage through a resistor (R61–R120). The bias is such that an LED associated with the particular input lights when the input is grounded. In addition, the board includes sixty analog input lines (I1,J1A–A15,J1A, I1,J1B–I15,J1B; I1,J2A–A15,J2A; and I1,J2B–I15,J2B). The analog inputs are accepted via an associated 15 pin D connector (J1,A and B; J2, A and B)

As illustrated in FIGS. 1-4 through 1-7, the inputs are isolated via a group of opto-isolators (U1–U16). The outputs from the opto-isolators (U1–U16) are multiplexed using a series of muxes (U17–U24). Using the muxes (U17–U24), one of the eight mux inputs are selected for output. The selection is provided by AIN0–AIN2 from a PLC (U26) as described hereinafter. Alternatively, the mux outputs are selected using an optional PLC (U40) as described hereinafter.

The mux outputs (DIN1–DIN8) form the data input for PLC (U26), or optionally, PLC (U40). As illustrated in FIGS. 1-9 and 1-14, the mux outputs (DIN1–DIN8) are electrically connected to PLC (U26) at Port A (PA0–PA7). In one particular embodiment, PLC (U26) is a BL1800 series PLC offered by ZWORLD, Inc.

Alternatively or in addition, the mux outputs (DIN1–DIN8) are electrically connected to PLC (U40) at Port B (PB2–PB5). In embodiments, PLC (U40) is optionally populated and can be a core microprocessor module offered as RCM2100 again offered by ZWORLD, Inc.

Outputs (DOUT1–DOUT7) are output from port E of PLC (U26) and/or optionally from port A of PLC (U40). In addition, PLC (U26) provides input address selection lines (AIN0–AIN2) via port D, and PLC (U40) provides the same address lines using a combination of ports D and E. Address out (AOUT0–AOUT2) lines are provided using the same ports.

As previously mentioned, the address in lines (AIN0–AIN2) are used to control the muxes (U17–U24) in determining which of a variety of input signals to drive the PLC(s). In one case, the address lines are cycled to make an eight bit parallel input into an eight bit serial stream. Thus, for example, inputs (I1 and I9) can be selected through the mux (U17) and carried serially thereafter as DIN1 to the PLC(s).

Similarly, the address out signals (AOUT0–AOUT2) control the signals provided to the outputs as described further below. Thus, as just one example, the same DIN1 signal can be transferred to DOUT1 as a serial signal, and clocked out as parallel output signals. Referring to FIG. 1-8, high current latches (U27–U34) are used to accept the serial DOUT signals from the PLC(s), latch the distinct signals carried thereon, and provide the signals as outputs (1,J3A–15,J3A; 1,J3B–15,J3B; 1J4A–15,J4A; and 1J4B–15,J4B). The high current latches are capable of driving up to 350 mA per output, but each of the outputs are fused at 250 mA using fuses (F1–F60).

Of note, each of the I/O are individually fused. This is contrary to the approach known in the art where the I/O would typically be controlled by a common fuse to reduce costs. In contrast, however, it has been found that down time on one or more mail processing machines to which the I/O are related can be considerable and costly. By adding individual fuses, a failing circuit can be quickly identified by determining the failing fuse, and can then be repaired. Such an approach can reduce down time of the mailing machines, and increase productivity. Further, lower value fuses can be selected to provide additional isolation.

As illustrated in FIGS. 1-15 through 1-16, the sixty outputs (1,J3A–15,J3A; 1,J3B–15,J3B; 1J4A–15,J4A; and 1J4B–15,J4B) are each attached to an LED (D1–D60) biased to light when the individual outputs are at a low voltage, and to turn off when the outputs are at a high voltage potential. Each of the outputs are accessible via an associated 15 pin D connector (J3, A and B; J4, A and B).

Address in lines, address out lines, the data in and out lines, and the associated clock and control signals are all under control of software operating on PLC(s) (U26, U40). In some cases, the input and output connectors are designed to logically control related items. For example D-connector J1,A may receive input from a particular set of potentiometers associated with a mail processing line, and D-connector J3 may be associated with a related set of solenoids associated with the same mail processing line. Thus, the logical arrangement of the I/O interfaces makes programming PLC(s)(U26, U40) more efficient and easily accomplished.

More particularly, in one embodiment, a single address select input from one D-connector and provides output from another D-connector. Thus, a programmer need only use one address to access input from a related group of inputs (e.g., potentiometers), and the same address to provide outputs to a related group of outputs (e.g., solenoids).

The circuit additionally includes a failsafe mechanism which can drive the outputs to an inactive state upon failure of either or both of the PLCs. In operation, the failsafe circuit monitors one or more clocks from the PLC(s). When a clock goes inactive for more than 650 ms, then all of the outputs are driven to an inactive state and the PLC(s) are reset. If the clocks never again reactivate, the outputs remain in the inactive state. On the other hand, once the clocks begin operation anew, the PLC drives the outputs to a default state and then ultimately back to an operational state under software control.

In some instances, the analog inputs are zero through five volt inputs used to detect voltage information obtained from linear potentiometers. Such linear potentiometers can be used to detect the thickness of a stack of mail being processed in a mail processing system.

In various aspects of the present invention, one or more of the previously described circuit boards can be daisy chained to create additional I/O capacity. Additional failsafe features may be included to detect the presence of failures of upstream boards. Such failures can be detected by the absence of clock activity and result in the inactivation of outputs on all boards (or a portion of boards) in the daisy chain.

The board is programmable through use of the PLC(s). The I/O speed of the board can be directly controlled by the clock driving the PLC. Thus, in some cases, boards with I/O speed up to that of the PLC can be developed. In various embodiments, the address lines only have to be set once to provide for use of the board in relation to a mail processing system. This reduces the complexity of any related software running on the PLC(s).

Referring to FIG. 2, a flow diagram 250 illustrates a method in accordance with the present invention for operating the circuit board illustrated in FIGS. 1, and 1-1 through 1-18. Following flow diagram 250, the input and output ports of the circuit board are configured (block 255). Such configuration can include asserting the proper address signals to select the desired inputs and/or outputs. Once all of the inputs and/or outputs are configured, the outputs are enabled and driven by PLC (U26), and the inputs are received at PLC (U26) (blocks 260, 265). A timer is monitored (block 270). In some cases, the timer indicates the active status of PLC (U26). Where the timer is active (block 270) operation of the inputs and outputs continues as previously described. Alternatively, where the timer is inactive (block 270) it is determined how long the timer has been inactive (block 275). Where the timer has been inactive for less than a predefined period, operation of the inputs and outputs continues as previously described. Alternatively, where the timer has been inactive for more than the predefined period (block 275) the output ports are disabled (block 280). This prevents outputs from being driven when PLC (U26) has become disabled or damaged. In some cases, the predefined period is approximately 650 milliseconds. In other embodiments, the predefined period is programmable and can be matched to a particular application. For example, in one embodiment, the predefined period is programmed by selecting hardware components, such as resistors and capacitors to be associated with the 74123 parts of FIG. 1-18.

One embodiment of a timer circuit for performing the methods as previously described is illustrated in FIG. 1-18. The PCLOCK signal from PLC (U26) drives the B input of a one millisecond timer (U39A). Thus, when PCLOCK is active a series of one millisecond pulses will be driven by one millisecond timer (U39A). In contrast, when PCLOCK is inactive, the output of one millisecond timer (U39A) will go inactive. The output of one millisecond timer (U39A) is driven into a 650 millisecond timer (U38A) and resets the 650 millisecond timer. Thus, where PCLOCK goes inactive the output (Qbar) of 650 millisecond timer (U38A) will assert high after 650 milliseconds. When the output of 650 millisecond timer (U38A) asserts high, it drives the input of another one millisecond timer (U39B). This causes the output of one millisecond timer (U39B) that is tied to the RESET input of PLC U26) to assert, thus resetting PLC (U26). In addition, an output of one millisecond timer (U39B) drives the B input of an eight second timer (U38B). When the output from U39B is asserted, the output of eight second timer (U38B) asserts and disables the outputs of the board by asserting OTCLR. Where PCLOCK becomes active again after the RESET signal is asserted, the outputs of the board remain inactive for the eight second period as 650 millisecond timer will not time out again thus avoiding renewed assertion of the RESET signal. Alternatively, where PCLOCK does not become active after assertion of the RESET signal, 650 millisecond timer (U38A) again times out causing one millisecond timer (U39B) to assert the RESET signal starting the resent process over. In some embodiments, this reset process repeats indefinitely until the PCLOCK signal becomes active again.

In addition to disabling the outputs, PLC (U26) can be reset (block 285). Once PLC 285 has completed its reset, the timer again becomes active (block 290), and the input and/or output ports are again configured (block 255). From this point, the process repeats as previously described.

Referring to FIG. 3, various elements useful in manufacturing circuit boards, such as that described in relation to FIG. 1, and FIGS. 1-1 through 1-18 are illustrated. The elements include a container 205 of solder paste. Such solder paste is commercially available. Other elements include a circuit board 220 including lead lines 225 of a width 235 that are electrically connected to other elements and/or lead lines on circuit board 220 via wire traces 230. In addition, a commercially available syringe 210 is provided that can be loaded with the solder paste, and which provides an output orifice 240 sufficiently large to dispense the solder paste, yet small enough to assure application of only a limited amount of the solder paste. In some cases, the diameter of orifice 240 is approximately the same as width 235. In other embodiments, the diameter is slightly less than width 235. In some embodiments of the present invention, container 205 of solder paste is combined with syringe 210 in a kit with instructions on how to perform the methods as discussed in relation to FIG. 4.

Figures 1, 2, 3, 4:
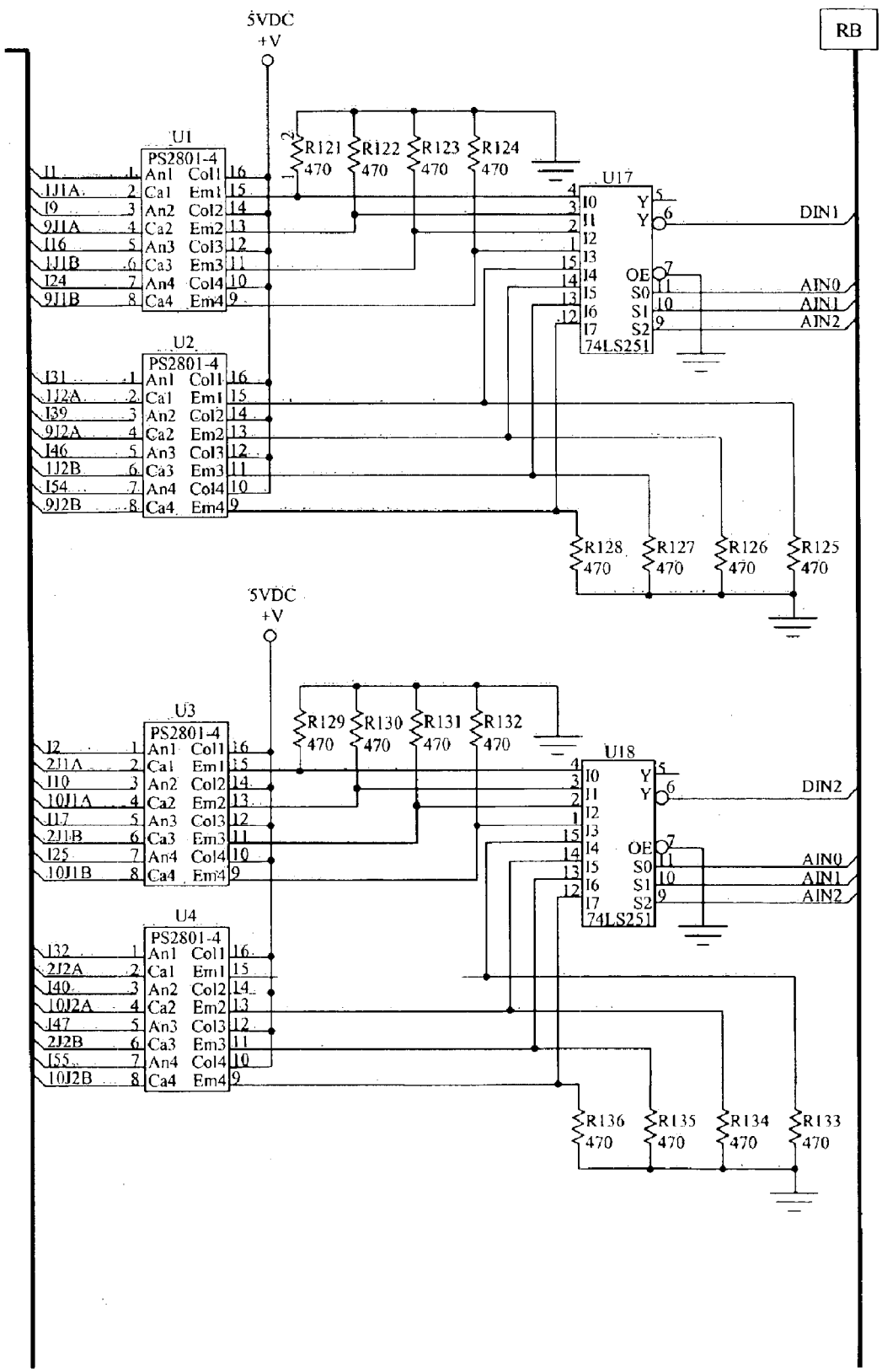
Figures 1, 2, 3, 4, 5:
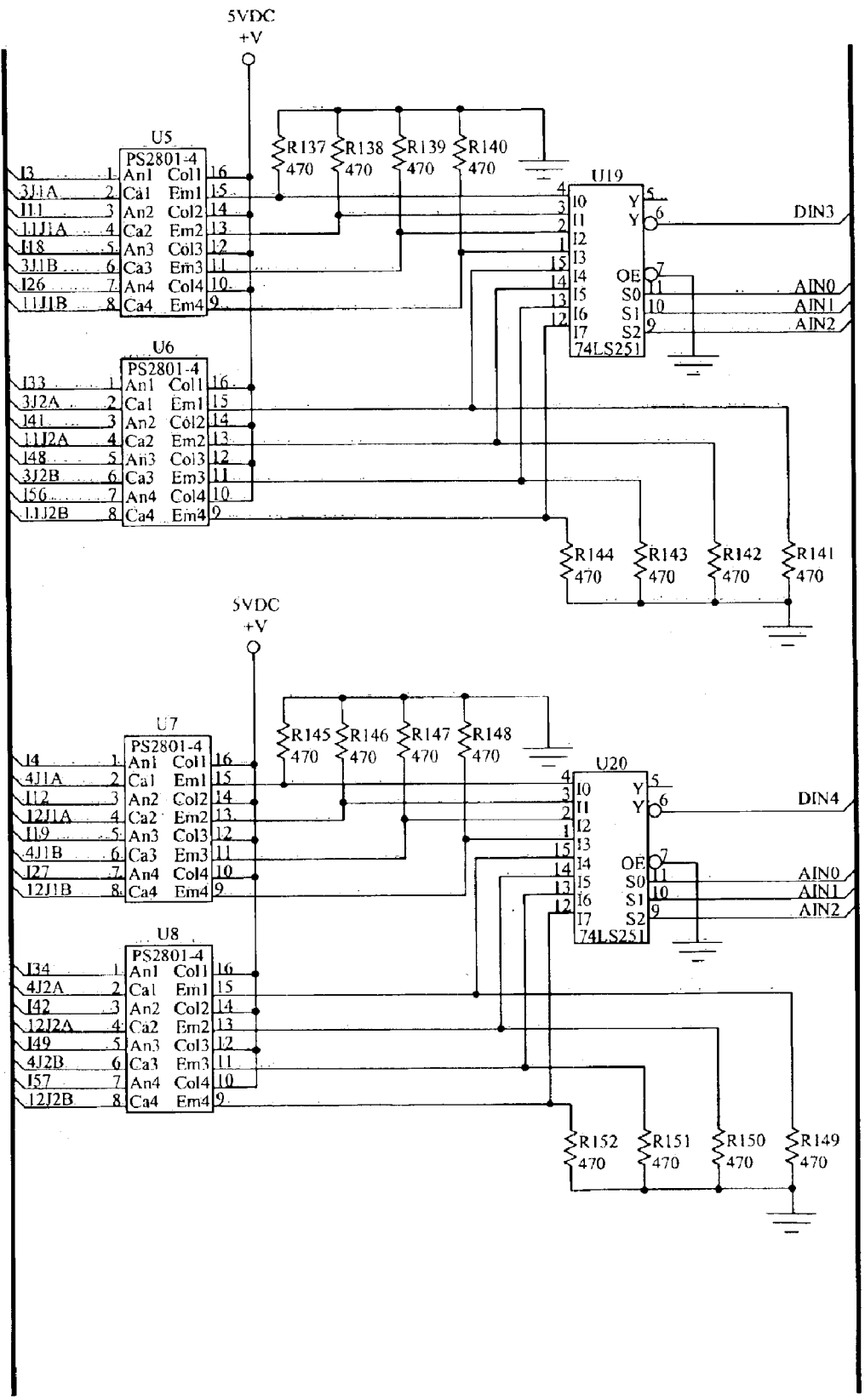
Figures 1, 2, 3, 4, 5, 6:
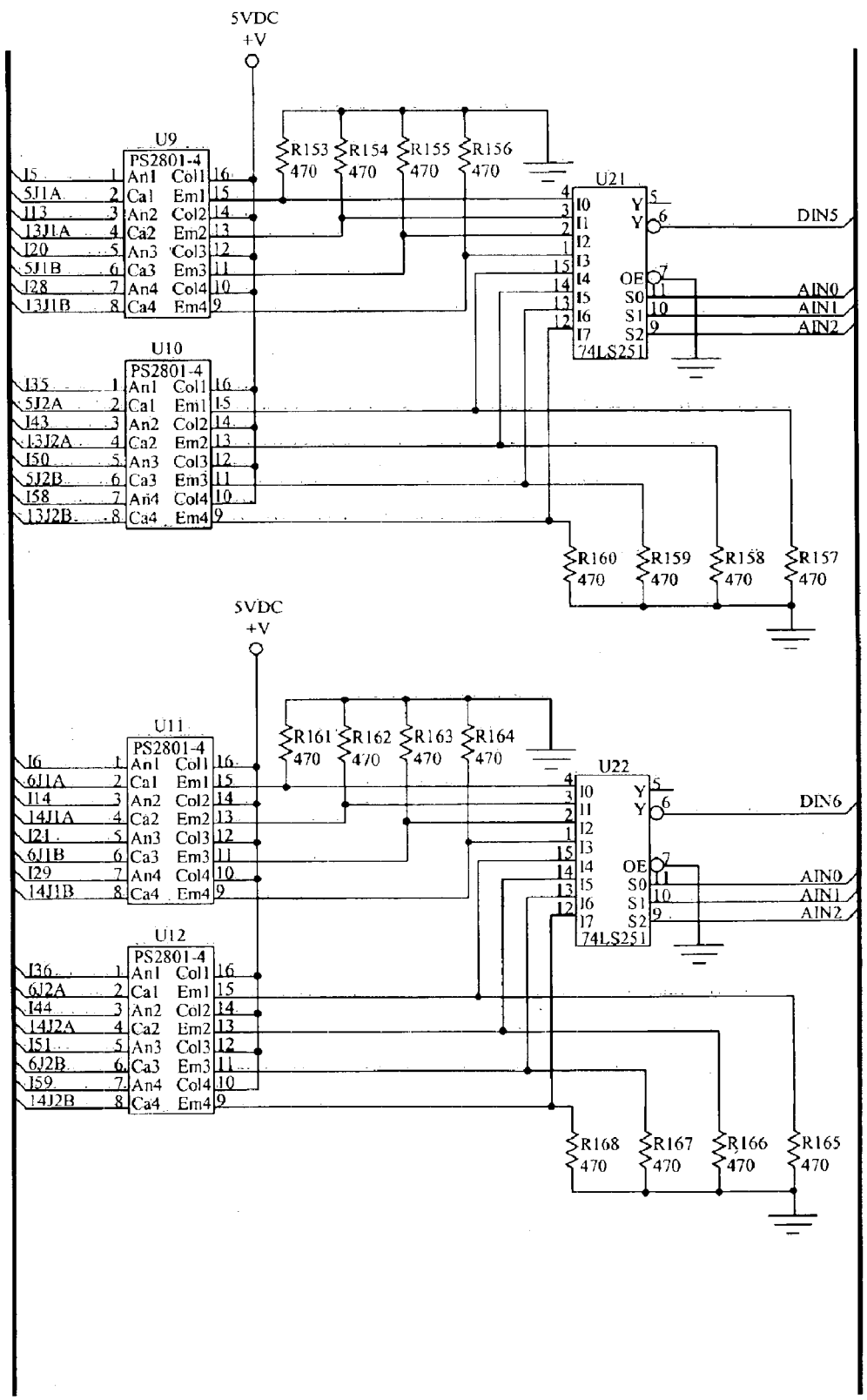
Figures 1, 2, 3, 4, 5, 6, 7:
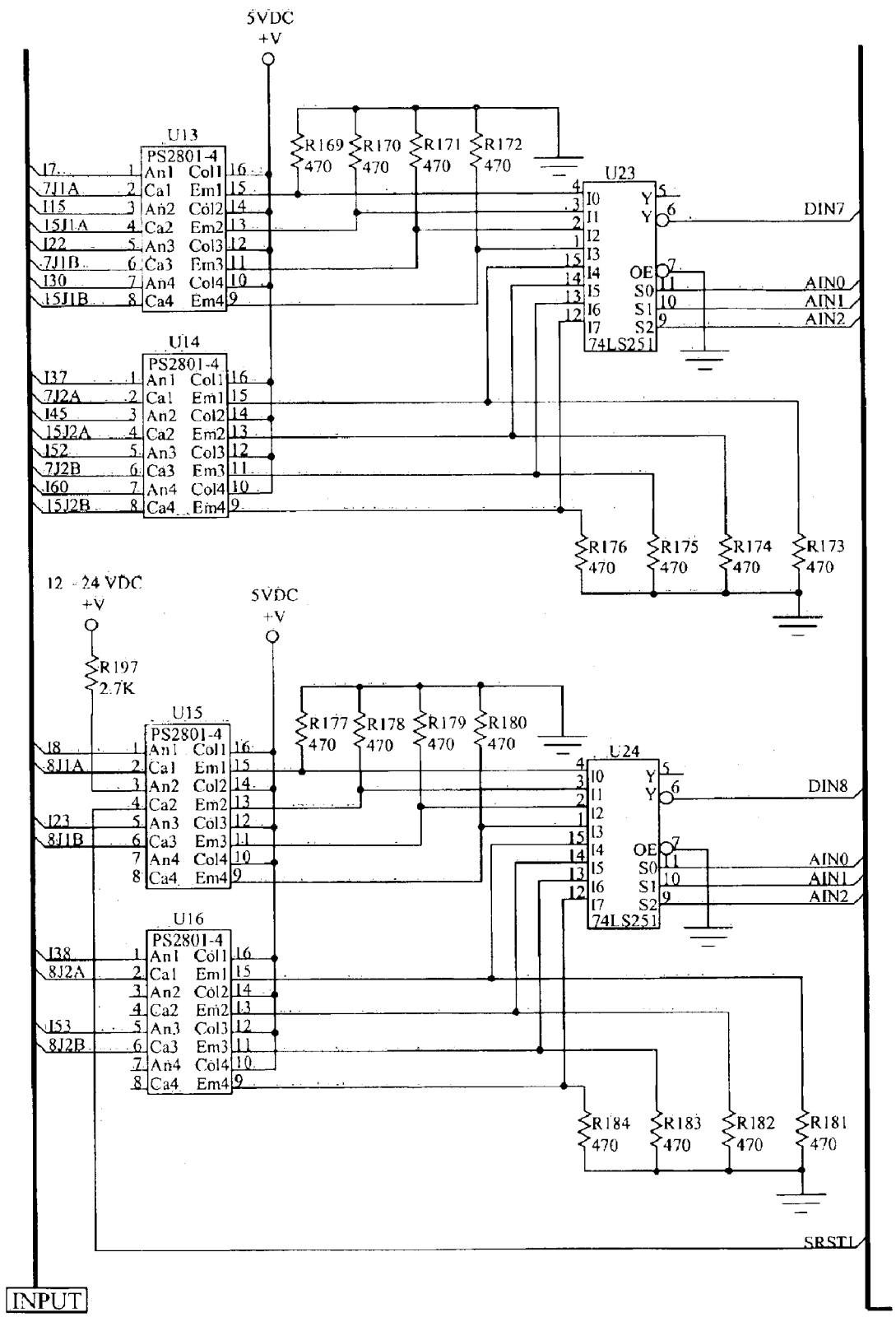
Figures 1, 2, 3, 4, 5, 6, 7, 8:
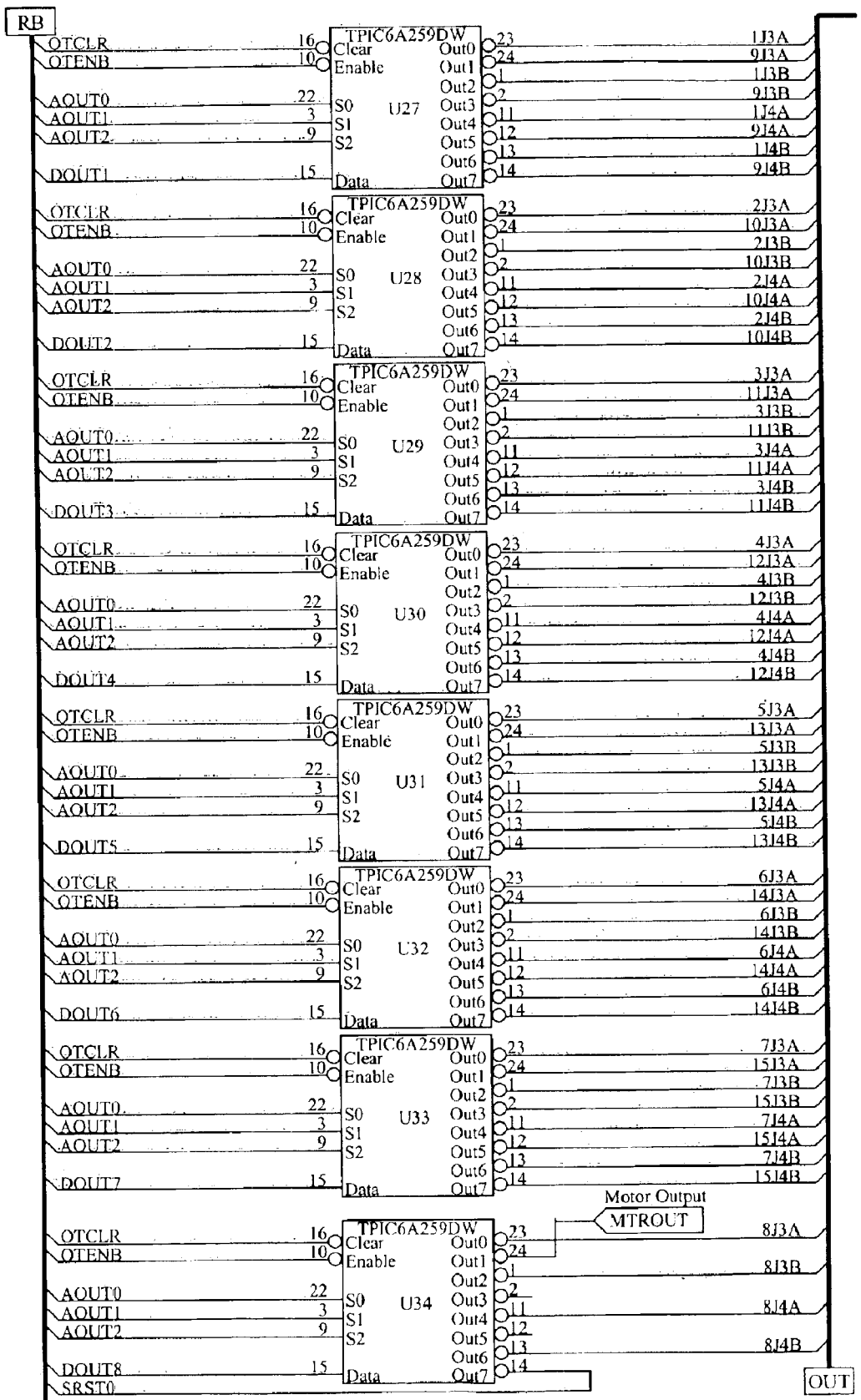
Figures 1, 2, 3, 4, 5, 6, 7, 8, 9:
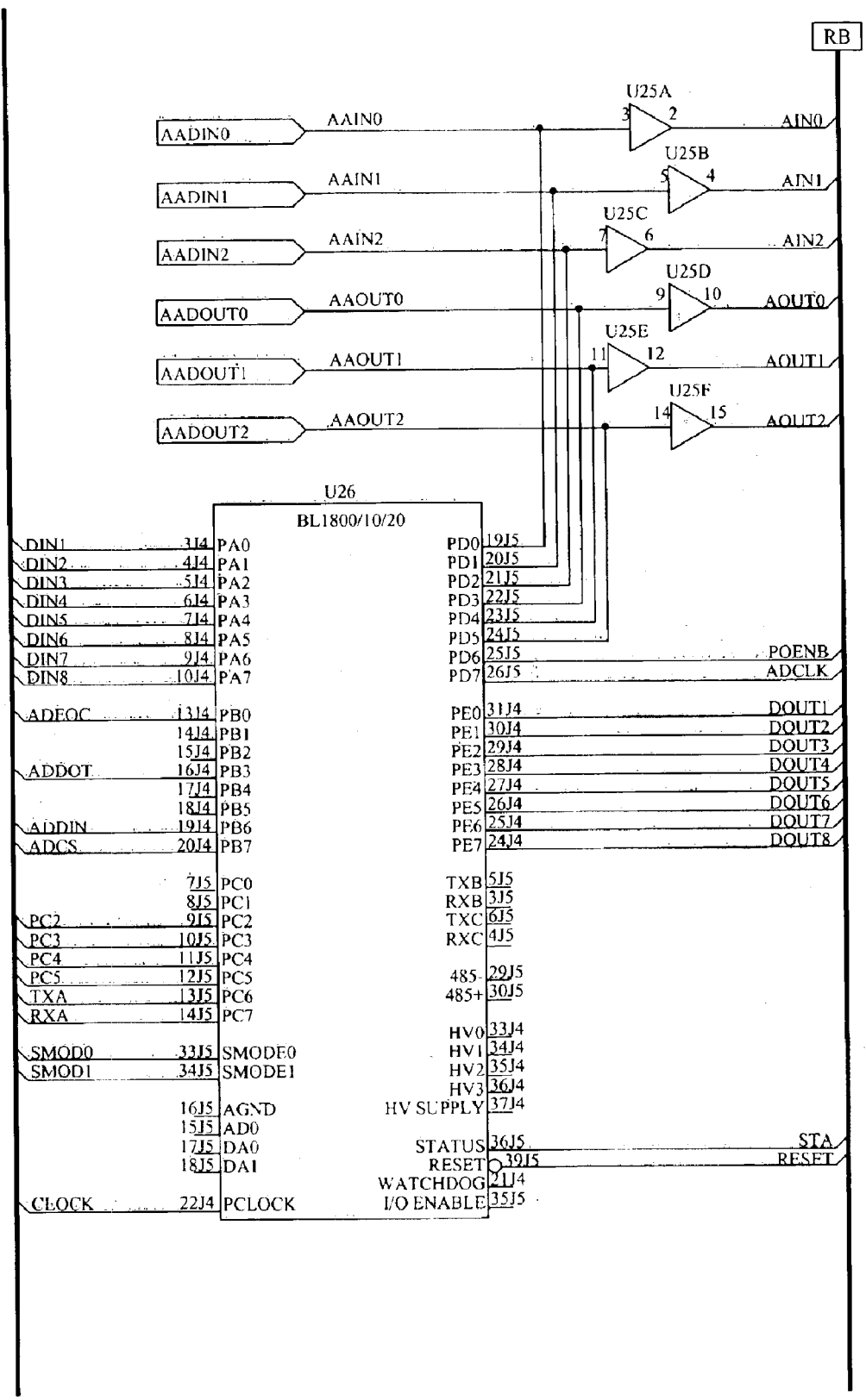
Figures 1, 2, 3, 4, 5, 6, 7, 8, 9, 10:
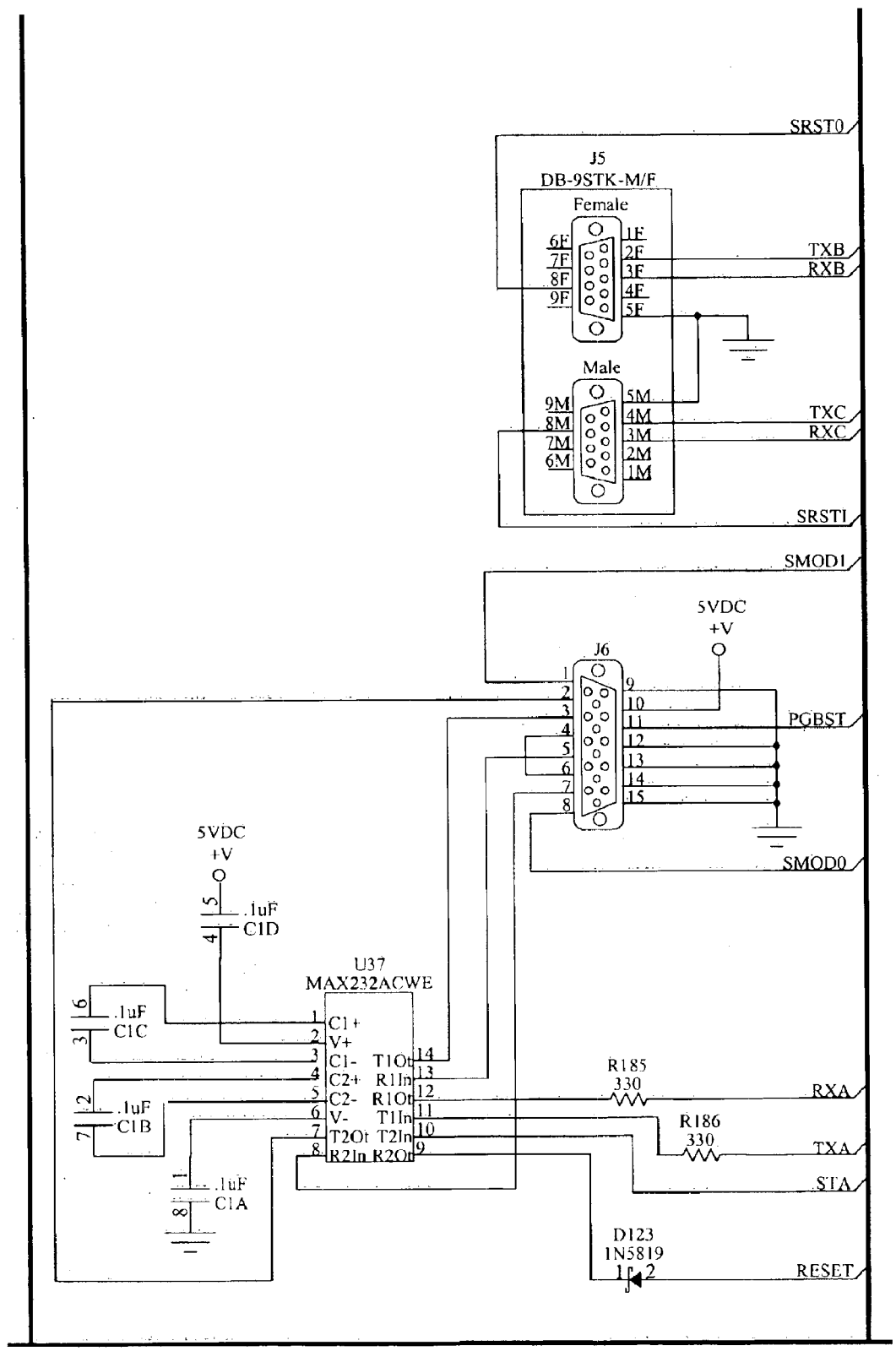
Figures 1, 2, 3, 4, 5, 6, 7, 8, 9, 10, 11:
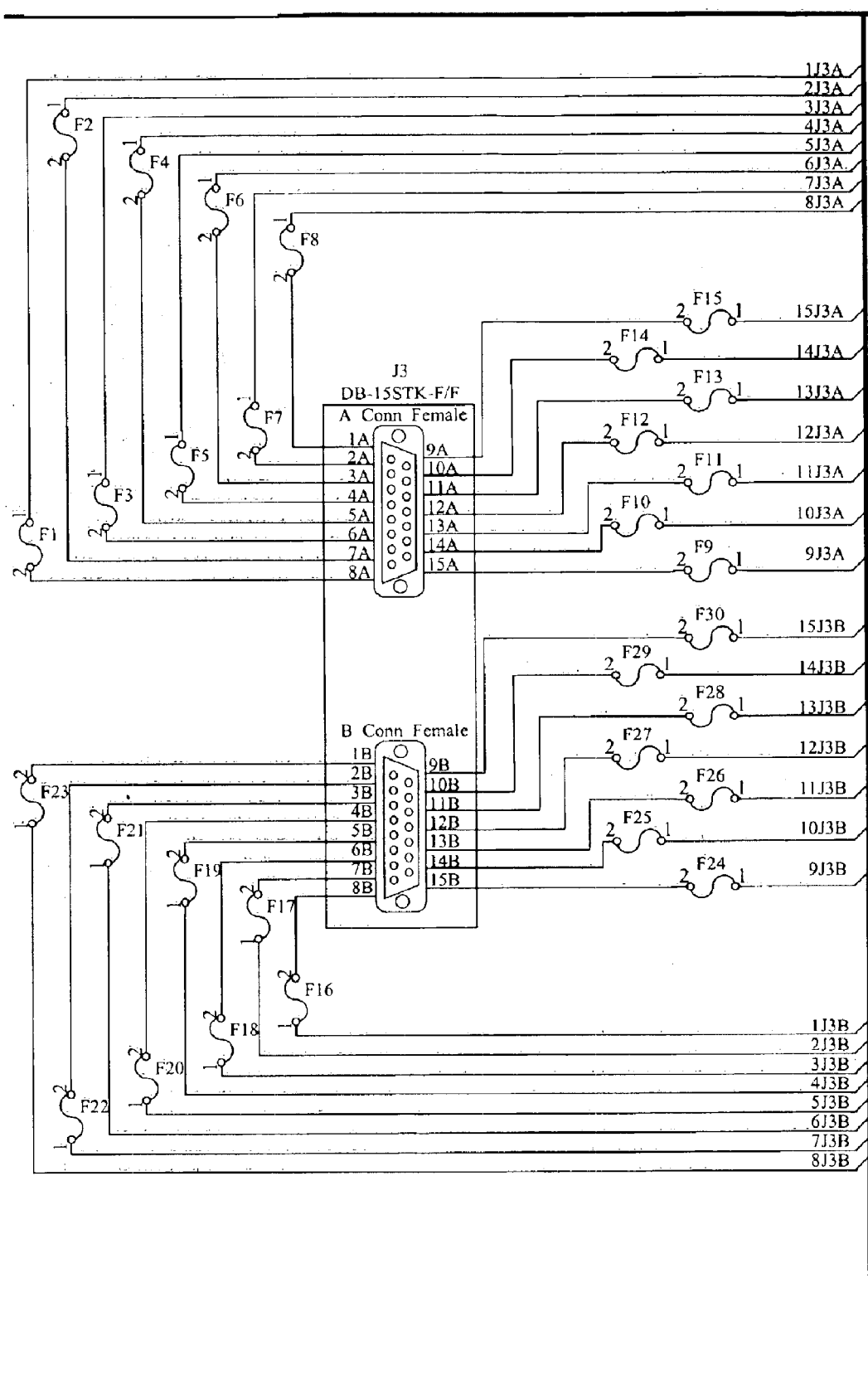
Figures 1, 2, 3, 4, 5, 6, 7, 8, 9, 10, 11, 12:
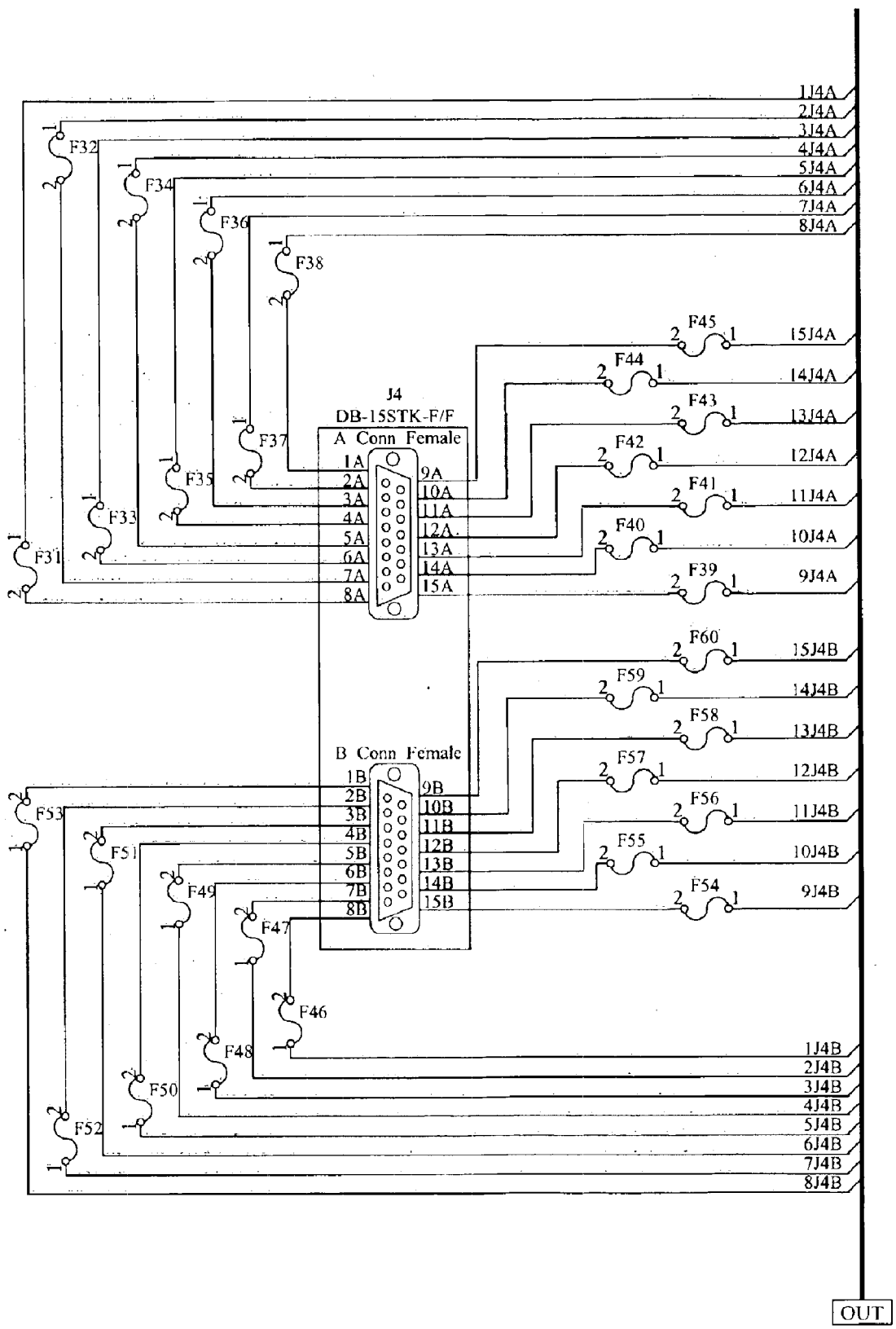
Figures 1, 2, 3, 4, 5, 6, 7, 8, 9, 10, 11, 12, 13:
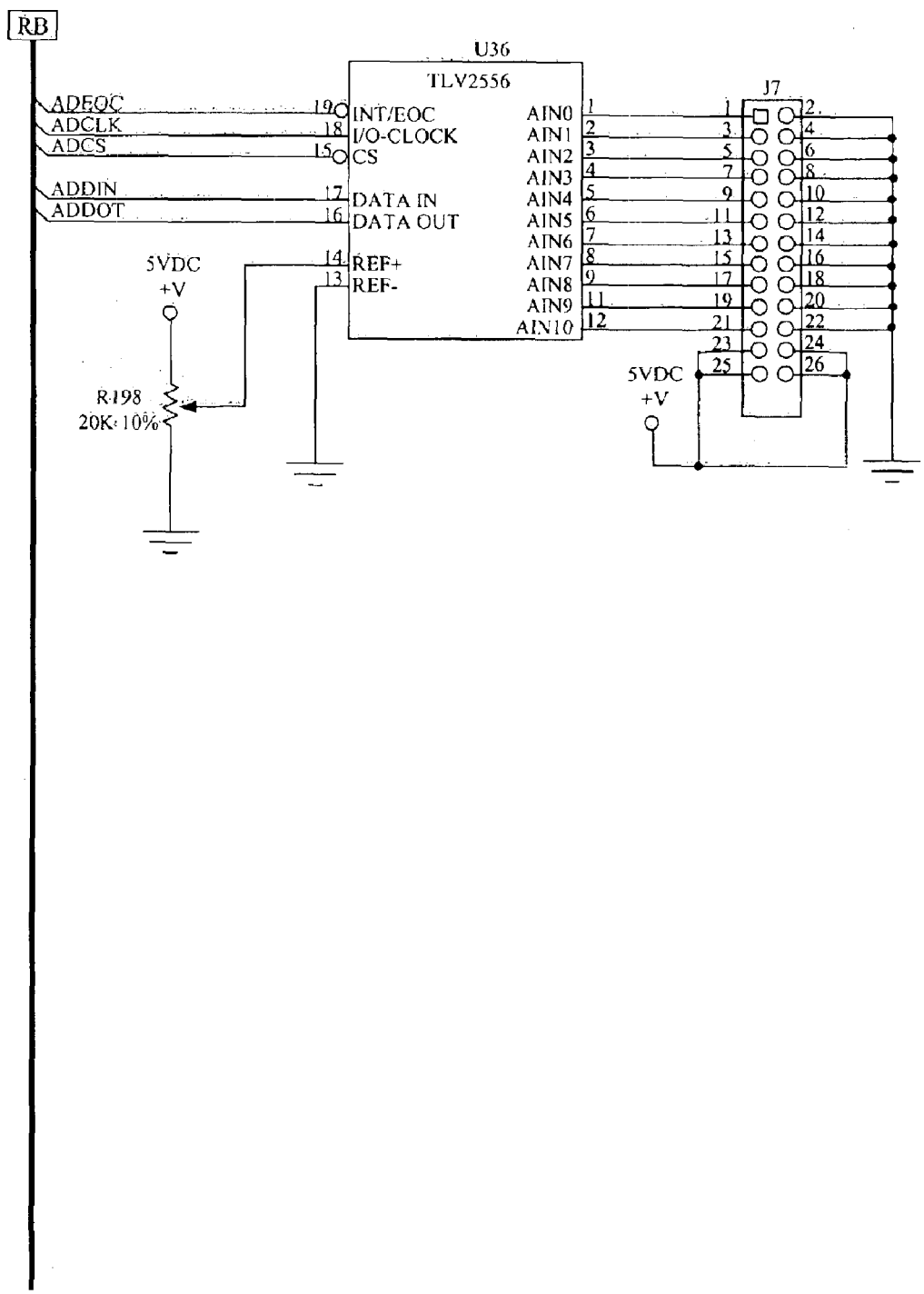
Figures 1, 2, 3, 4, 5, 6, 7, 8, 9, 10, 11, 12, 13, 14:
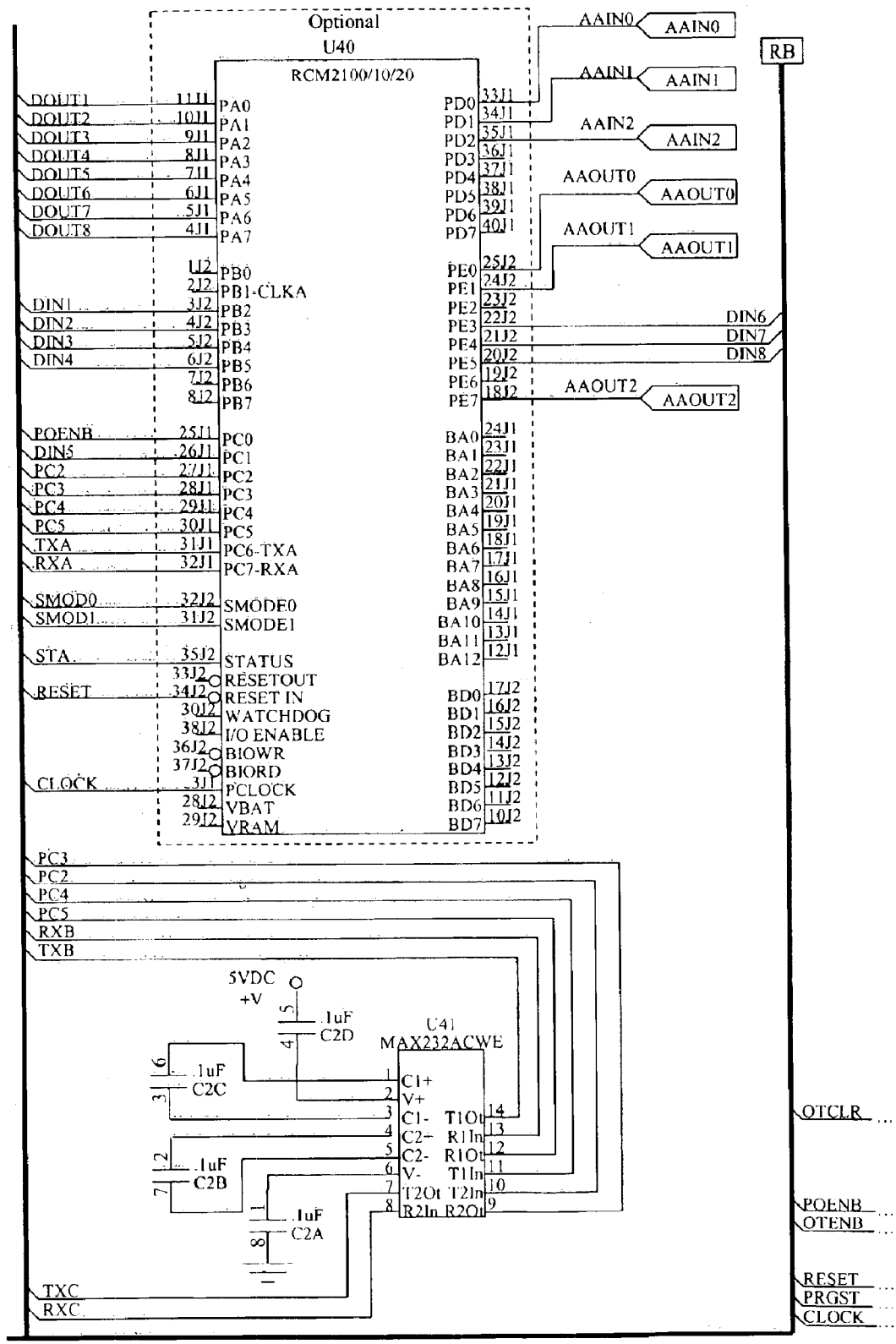
Figures 1, 2, 3, 4, 5, 6, 7, 8, 9, 10, 11, 12, 13, 14, 15:
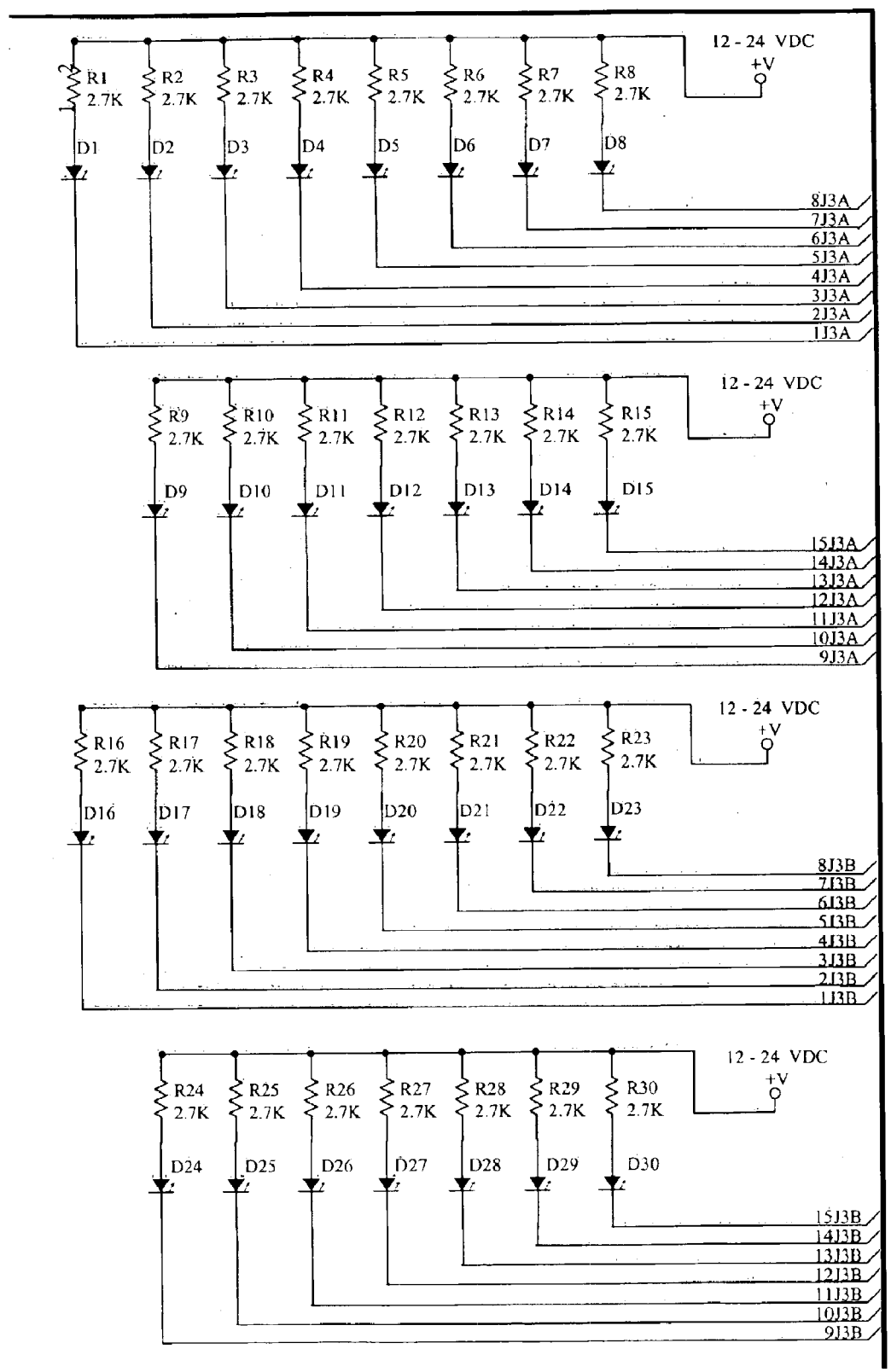
Figures 1, 2, 3, 4, 5, 6, 7, 8, 9, 10, 11, 12, 13, 14, 15, 16:
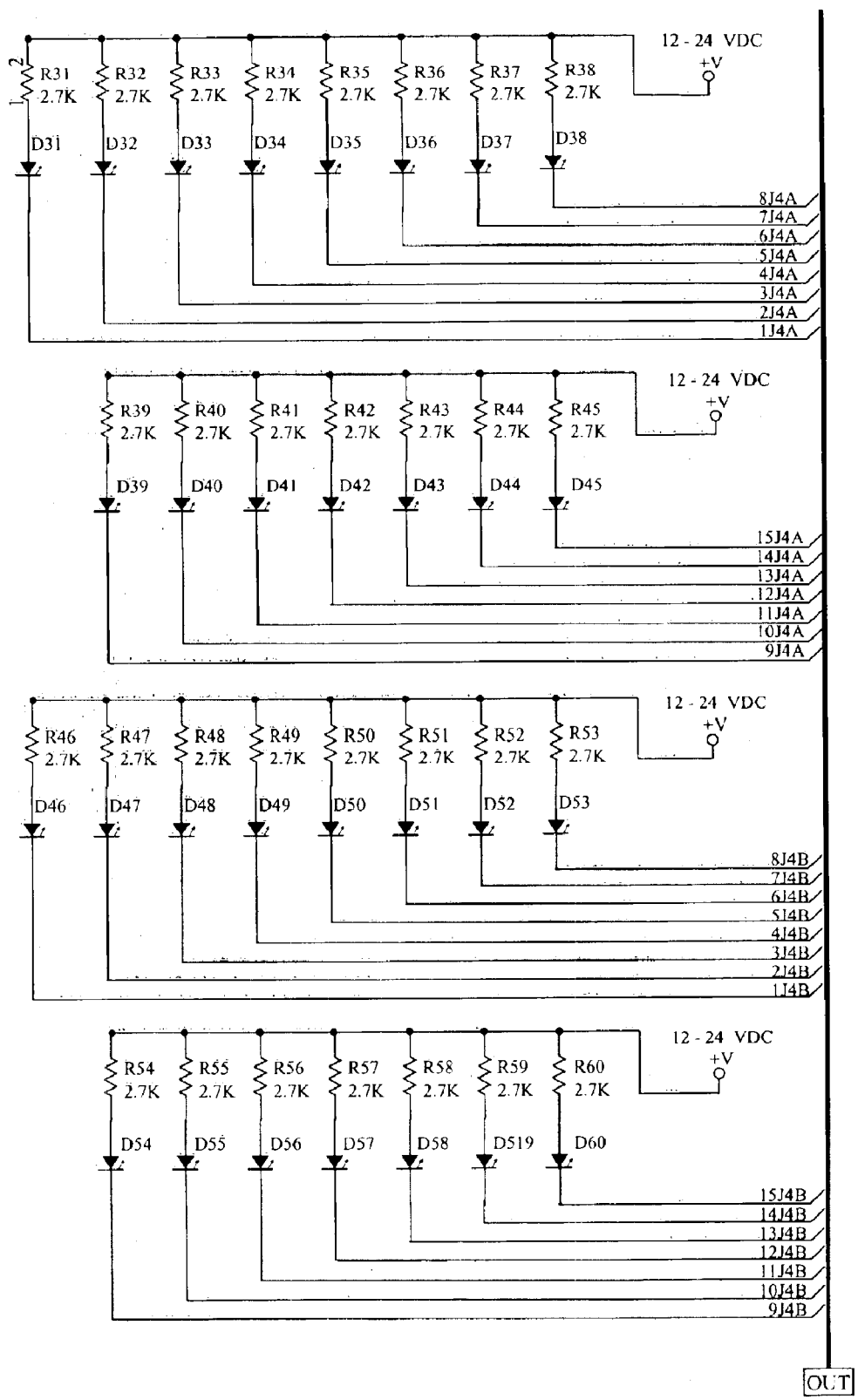
Figures 1, 2, 3, 4, 5, 6, 7, 8, 9, 10, 11, 12, 13, 14, 15, 16, 17:
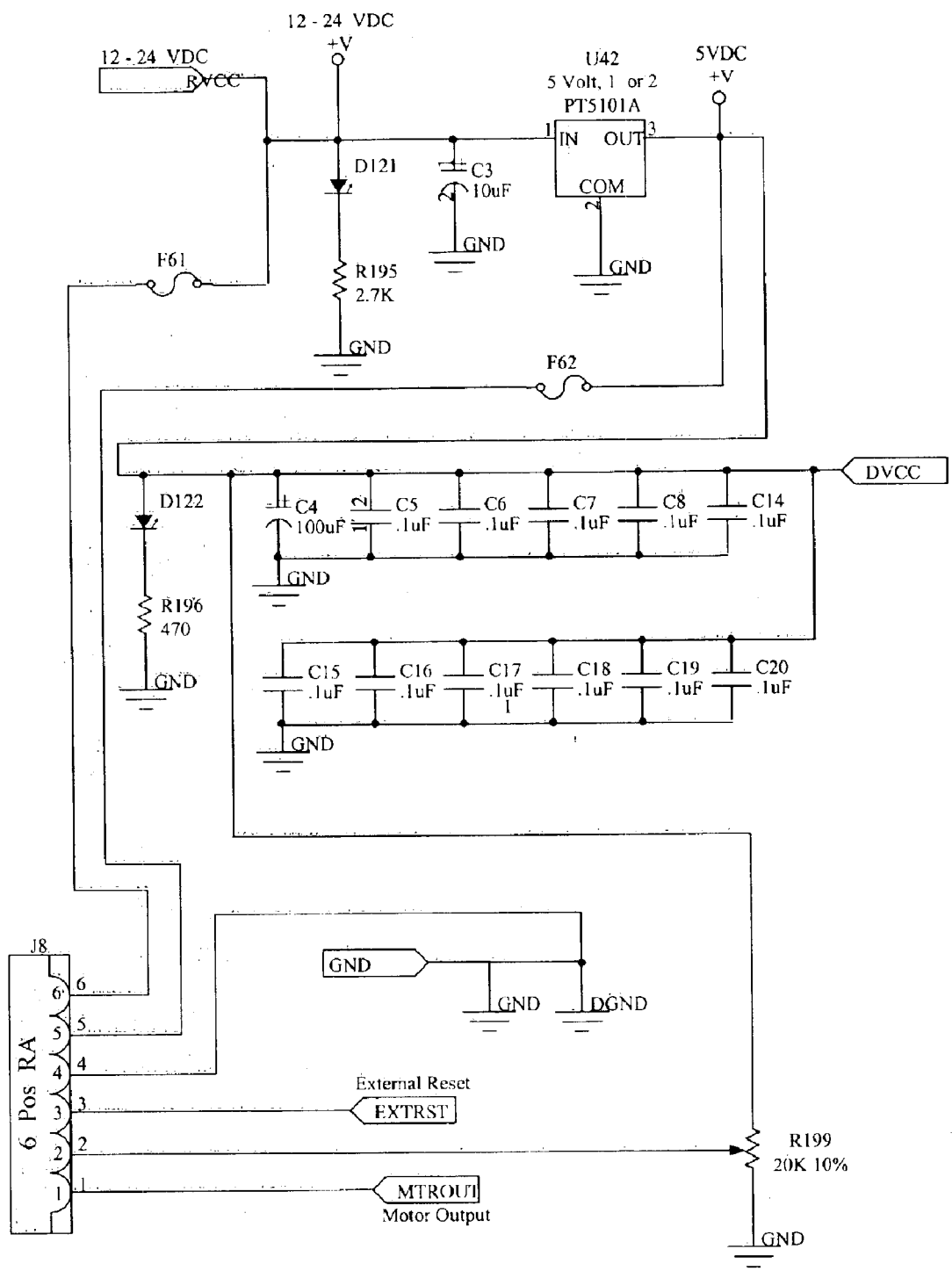
Figures 1, 2, 3, 4, 5, 6, 7, 8, 9, 10, 11, 12, 13, 14, 15, 16, 17, 18:
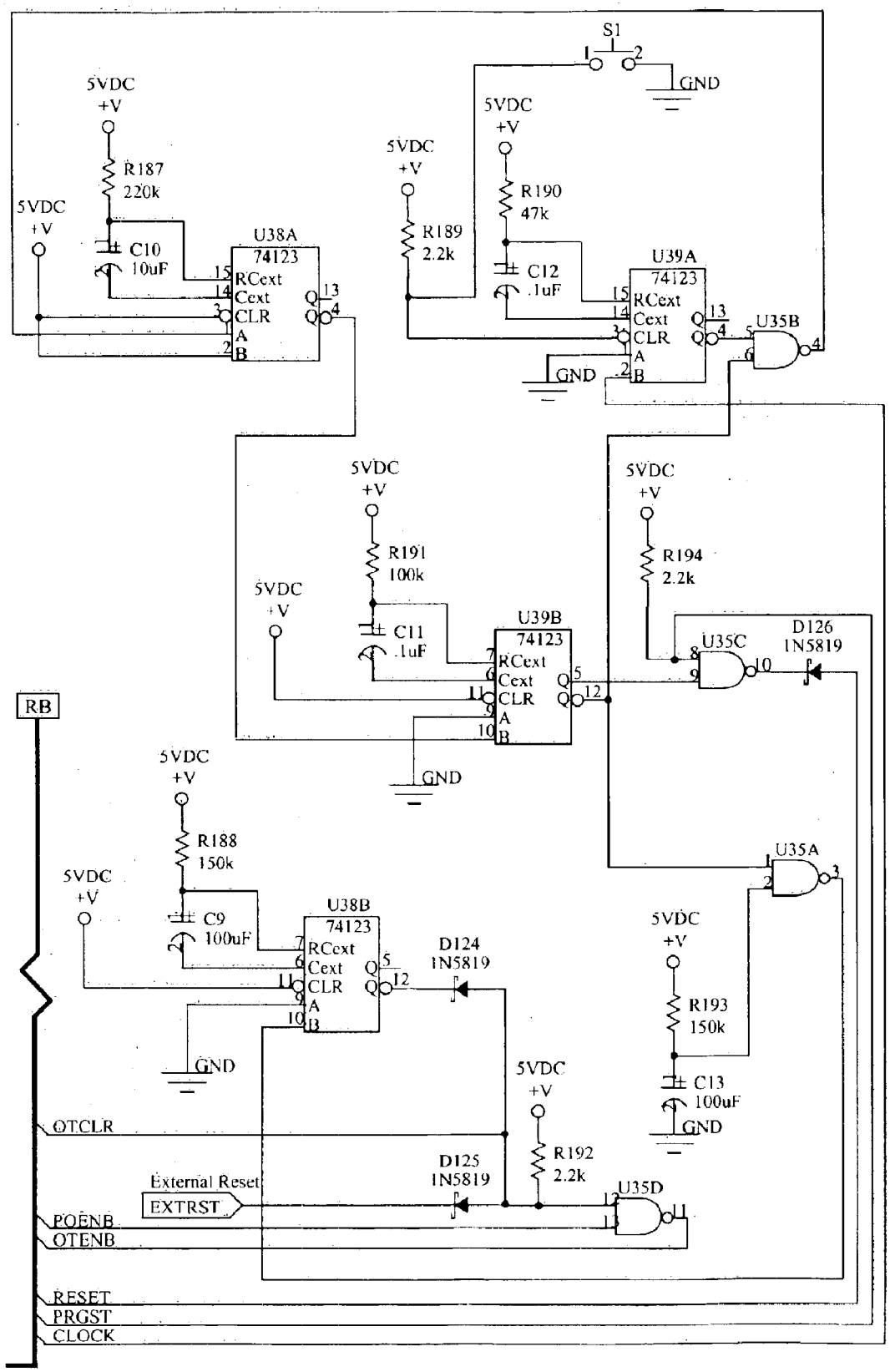
Figure 2:
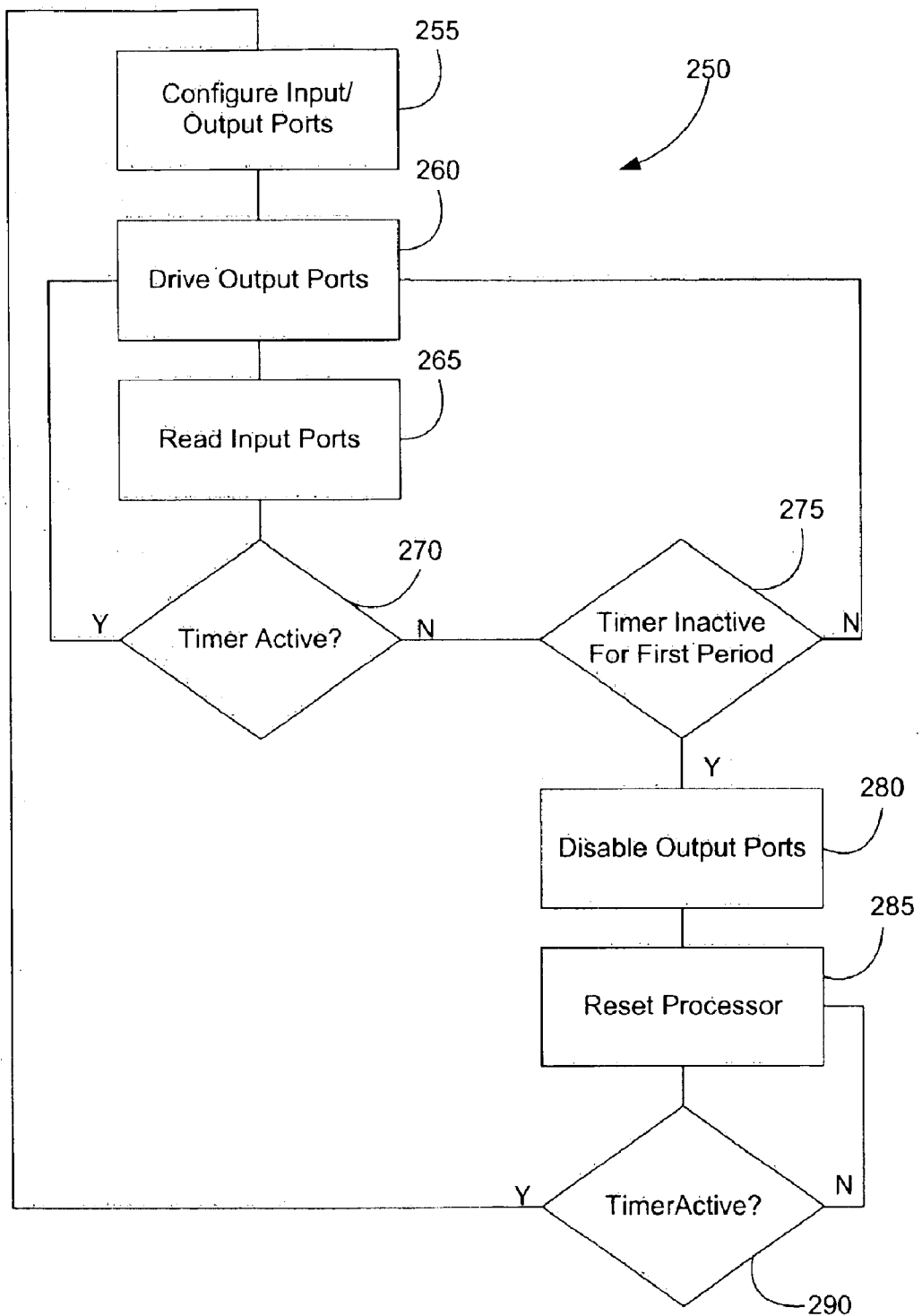
Figure 3:
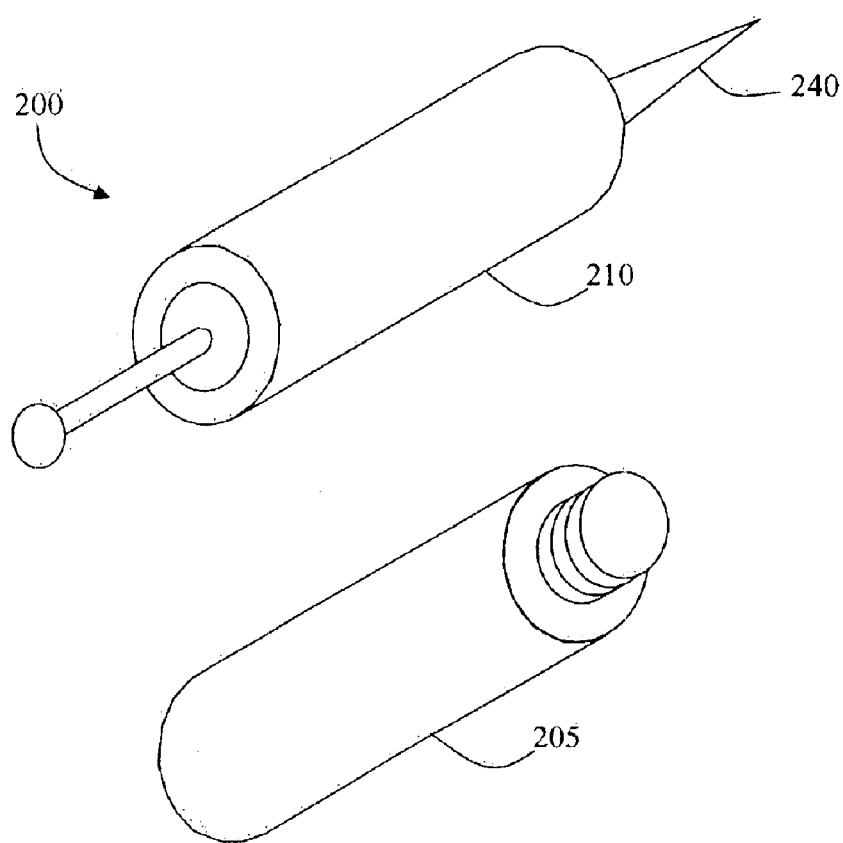
Figure 3:
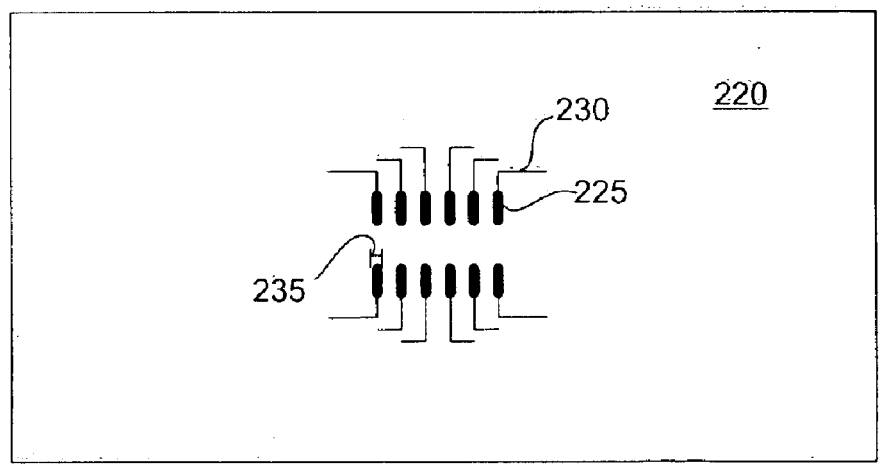
Figure 4:
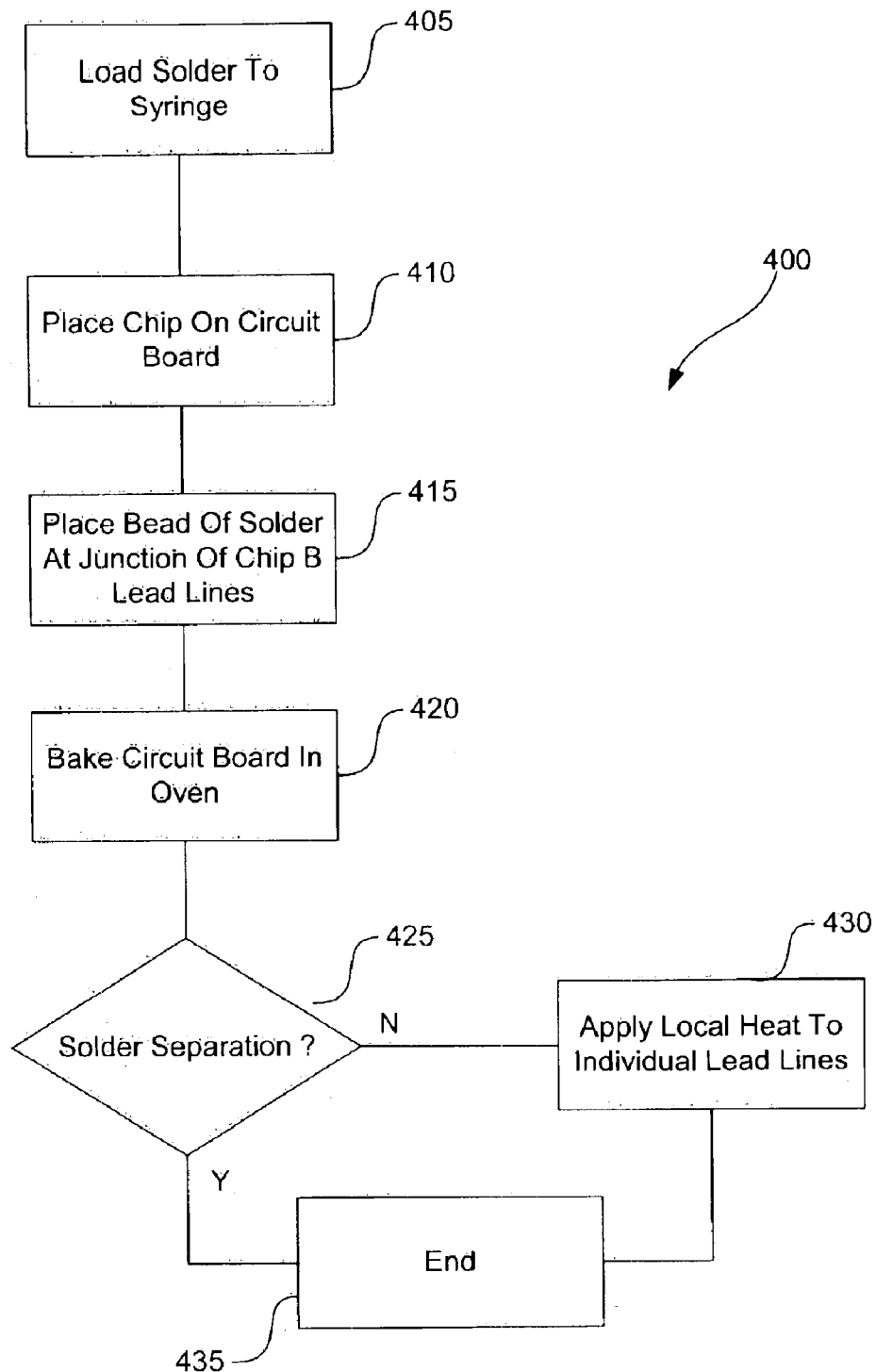

Referring to FIG. 4, a flow diagram 400 illustrates a method in accordance with an embodiment of the present invention for manufacturing circuit boards. Following flow diagram 400, solder paste 205 is loaded into syringe 210 (block 405). A surface mount chip is placed on circuit board 220 such that lead lines from the chip touch lead lines 225 (block 410). Syringe 210 is used to dispense a bead of solder paste approximately perpendicular across the junction of the chip leads and lead lines 225 (block 415). Thus, for example, where seven lead lines 225 exist, a single solder bead crossing the seven lead lines can be dispensed. Circuit board 220, along with the chip and the applied solder paste is loaded into an oven where it is baked (block 420). The temperature and period of the baking process is governed by the type of solder paste used, the width of lead lines 225, and/or the size of diameter 240. In one particular embodiment, circuit board 220 is baked for fifteen minutes at 350 degrees Fahrenheit.

Once the baking process is completed, circuit board 220 is inspected to determine if the solder paste has melted and adhered to lead lines 225. In addition, it is determined whether the solder has adhered across lead lines resulting in electrical shorts (block 425). Where such shorting is apparent, local heat is applied to the shorted area such that the solder flows to and adheres to individual lead lines (block 430). Local heat can be applied to individual leads, or areas of the circuit board using, for example, a soldering iron or heating gun. Otherwise, the process is complete (block 435).

Using such an approach, a low cost prototype circuit board can be manufactured. Further, the process avoids the commonly used approach of hand soldering that can result in warping of circuit board 220, and lifting of lead lines 225. Yet further, the approach limits costs involved in manufacturing prototypes by eliminating the need for a solder mask. One of ordinary skill in the art will recognize the myriad of other advantages afforded through use of the method. Additionally, one of ordinary skill in the art will recognize various modifications that can be made to the method in accordance with the present invention.

The invention has now been described in detail for purposes of clarity and understanding. However, it will be appreciated that certain changes and modifications to the previously described embodiment that can be made within the scope of the present invention. Based on the disclosure provided herein, such changes and modifications will be apparent to those of ordinary skill in the art. Thus, the functions of the systems and methods of using such are merely exemplary. Accordingly, it should be recognized that many other systems, functions, methods, and combinations thereof are possible in accordance with the present invention.

What is claimed is:

1. A system for accepting and producing various I/O, the system comprising:
    a plurality of input connectors integral to a board;
    a plurality of output connectors integral to the board;
    an output disable circuit associated with the plurality of output connectors;
    a programmable logic controller modular to the board and electrically coupled to the plurality of input connectors and the plurality of output connectors, wherein the programmable logic controller is associated with a computer readable medium, and wherein the computer readable medium comprises instructions executable by the programmable logic controller to configure at least one of the plurality of output connectors and to output a timer clock signal; and
    a timer circuit coupled to the programmable logic controller for sending a signal to the output disable circuit after the timer clock signal is inactive for a predetermined period of time.

2. The system of claim 1, wherein each of the plurality of output connectors includes a power source, and wherein the power source to each of the plurality of output connectors is individually fused in relation to each of the output connectors.

3. The system of claim 1, wherein each of the plurality of input connectors is configurable to drive an output signal.

4. The system of claim 3, wherein each of the plurality of output connectors is configurable to accept inputs.

5. The system of claim 1, wherein the computer readable medium further comprises:
    instructions to configure at least one of the plurality of input connectors to drive an output, and to drive the output.

6. The system of claim 1, wherein the computer readable medium further comprises instructions to configure at least one of the plurality of output connectors to receive an input, and to receive an input signal therefrom.

7. The system of claim 1, wherein the output disable circuit is programmed to disable the plurality of output connectors when the signal is received from the timer circuit.

8. The system of claim 7, wherein the predetermined period of time is approximately 650 milliseconds.

9. The system of claim 7, wherein the predetermined period of time is a first predetermined period of time, and wherein the output disable circuit comprises a first circuit for resetting the programmable logic controller, and a second circuit for disabling the output connectors for a second predetermined period of time, wherein the second predetermined period of time is greater than the time for the timer clock signal to become active.

10. The system of claim 9, wherein the second predetermined period of time is more than the time required to reset the programmable logic controller.

11. The system of claim 7, wherein the predetermined period of time is a first predetermined period of time, and wherein the computer readable medium further comprises instructions to:
    maintain the output connectors in the disabled state for a second predetermined period of time after the timer clock signal becomes active again; and
    to activate the output connectors after the second predetermined period of time has expired.

12. The system of claim 5, wherein the computer readable medium further comprises instructions to disable at least one of the plurality of input connectors configured to drive an output when the timer clock signal goes inactive for the predetermined period of time.

13. The system of claim 12, wherein the predetermined period of time is a first predetermined period of time, and wherein the computer readable medium further comprises instructions to maintain at least one of the plurality of input connectors configured to drive an output in the disabled state for a second predetermined period of time after the timer clock signal becomes active again.

14. The system of claim 7, wherein the predetermined period of time is a first predetermined period of time, and wherein the computer readable medium further comprises instructions to:
    maintain at least one of the plurality of input connectors configured to drive an output in the disabled state for a second predetermined period of time after the timer clock signal becomes active again; and
    activate at least one of the plurality of input connectors configured to drive an output after the second predetermined period of time has expired.

15. A method for receiving and driving I/O in a mail processing system, the method comprising:
    providing a set of configurable I/O ports, wherein each I/O port in the set of configurable I/O ports can be configured to be an I/O selected from a group consisting of: an input and an output;
    providing a configuration processor modularly coupled to the set of configurable I/O ports;
    programming the configuration processor to configure a first I/O port of the set of I/O ports as an input and a second I/O port of the set of I/O ports as an output;
    disabling the output after a clock associated with the configuration processor is inactive for a first predetermined period of time; and
    enabling the disabled output after the clock associated with the configuration processor has resumed activity for a second predetermined period of time wherein the second predetermined period of time is greater than the time required to reset the configuration processor.

16. The method of claim 15, the method further comprising: providing a fuse in relation to each of the set of configurable I/O ports.

17. The method of claim 15, wherein the first predetermined period of time is 650 milliseconds.

18. The method of claim 15, the method further comprising:

resetting the configuration processor after the first predetermined period of time and before the second predetermined period of time.

19. The method of claim 15, wherein the configuration processor is a programmable logic controller.

20. The system of claim 1, wherein the predetermined period of time is programmable.

21. The system of claim 1, further comprising a reset circuit connected to the programmable logic controller that is capable of receiving the output timer clock signal, wherein the reset circuit times out when the output timer signal is not received for a period of time greater than the predetermined period of time and sends a reset signal to the programmable logic controller.

22. The system of claim 21, wherein the reset circuit times out and sends an additional reset signal to the programmable logic controller when the output timer clock signal is not received for a second period of time, wherein the second period of time commences after the reset signal is sent and is greater than the predetermined period of time.

23. A system for accepting and producing various I/O, the system comprising:
  a plurality of input connectors integral to a board;
  a plurality of output connectors integral to the board, wherein each of the plurality of output connectors includes a power source, and wherein the power source to each of the plurality of output connectors is individually fused in relation to each of the output connectors;
  an output disable circuit associated with the plurality of output connectors; and
  a programmable logic controller modular to the board and electrically coupled to the plurality of input connectors and the plurality of output connectors, wherein the programmable logic controller is associated with a computer readable medium, and wherein the computer readable medium comprises instructions executable by the programmable logic controller to:
    configure at least one of the plurality of output connectors.

24. A system for accepting and producing various I/O, the system comprising:
  a plurality of input connectors integral to a board;
  a plurality of output connectors integral to the board;
  a programmable logic controller modular to the board and electrically coupled to the plurality of input connectors and the plurality of output connectors, wherein the programmable logic controller is associated with a computer readable medium, and wherein the computer readable medium comprises instructions executable by the programmable logic controller to configure at least one of the plurality of output connectors and to output a timer clock signal; and
  an output disable circuit associated with the plurality of output connectors wherein the output disable circuit comprises a first circuit for resetting the programmable logic controller, and a second circuit for disabling the output connectors for a predetermined period of time, wherein the predetermined period of time is greater than the time for the timer clock signal to become active.

25. A method for receiving and driving I/O in a mail processing system, the method comprising:
  providing a set of configurable I/O ports, wherein each I/O port in the set of configurable I/O ports can be configured to be an I/O selected from a group consisting of: an input and an output;
  providing a fuse in relation to each of the set of configurable I/O ports;
  providing a configuration processor modularly coupled to the set of configurable I/O ports;
  programming the configuration processor to configure a first I/O port of the set of I/O ports as an input and a second I/O port of the set of I/O ports as an output;
  disabling the output when a clock associated with the configuration processor goes inactive for a first period; and
  enabling the disabled output when the clock associated with the configuration processor resumes activity for a second period.

* * * * *